(12) United States Patent
Chiba et al.

(10) Patent No.: US 6,418,187 B1
(45) Date of Patent: Jul. 9, 2002

(54) X-RAY MASK STRUCTURE, AND X-RAY EXPOSURE METHOD AND APPARATUS USING THE SAME

(75) Inventors: Keiko Chiba; Shigeru Terashima, both of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/349,490

(22) Filed: Jul. 9, 1999

(30) Foreign Application Priority Data

Jul. 9, 1998 (JP) .......................................... 10-194196
Jun. 30, 1999 (JP) .......................................... 11-186518

(51) Int. Cl.[7] ................................................ G21K 5/00
(52) U.S. Cl. ............................. 378/35; 378/35; 430/5; 430/313
(58) Field of Search ......................... 378/34, 35; 430/5, 430/313

(56) References Cited

U.S. PATENT DOCUMENTS

| | | | |
|---|---|---|---|
| 5,576,147 A | * | 11/1996 | Guckel et al. .............. 430/313 |
| 5,607,733 A | * | 3/1997 | Fukuda et al. |
| 5,608,773 A | * | 3/1997 | Korenaga et al. ............. 378/34 |
| 5,733,688 A | * | 3/1998 | Kato et al. ..................... 430/5 |
| 5,751,780 A | * | 5/1998 | Fukuda et al. ................ 378/35 |
| 5,848,676 A | * | 12/1998 | Chiba et al. .................. 378/35 |
| 5,854,819 A | * | 12/1998 | Hara et al. .................... 378/34 |

FOREIGN PATENT DOCUMENTS

JP 404130621 A * 5/1992

* cited by examiner

*Primary Examiner*—David P. Porta
*Assistant Examiner*—Pamela R. Hobden
(74) *Attorney, Agent, or Firm*—Fitzpatrick, Cella, Harper & Scinto

(57) ABSTRACT

An X-ray mask structure and X-ray exposure method using the same are disclosed, wherein the mask has an X-ray absorptive material pattern, a supporting film for supporting the pattern, and a holding frame for holding the supporting film, wherein a suction port is arranged to be communicated with an external gas drawing system, and wherein a supply port is provided so that a gas can be supplied therethrough, for prevention of dust adhesion to the mask.

36 Claims, 18 Drawing Sheets

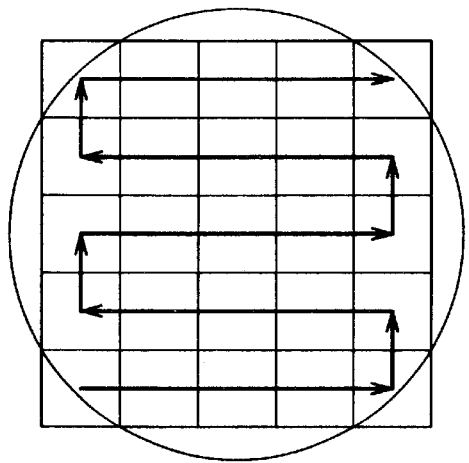
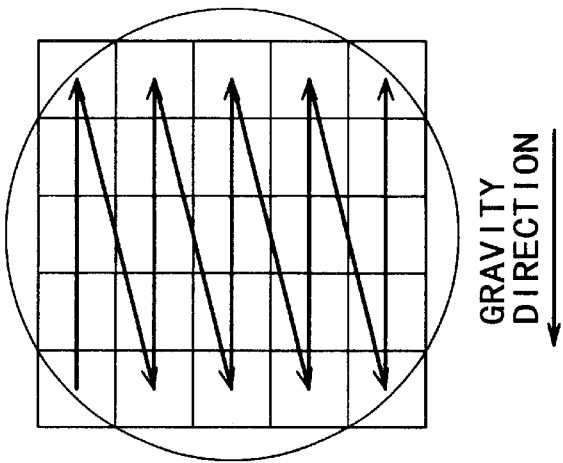
FIG. 13A    FIG. 13B
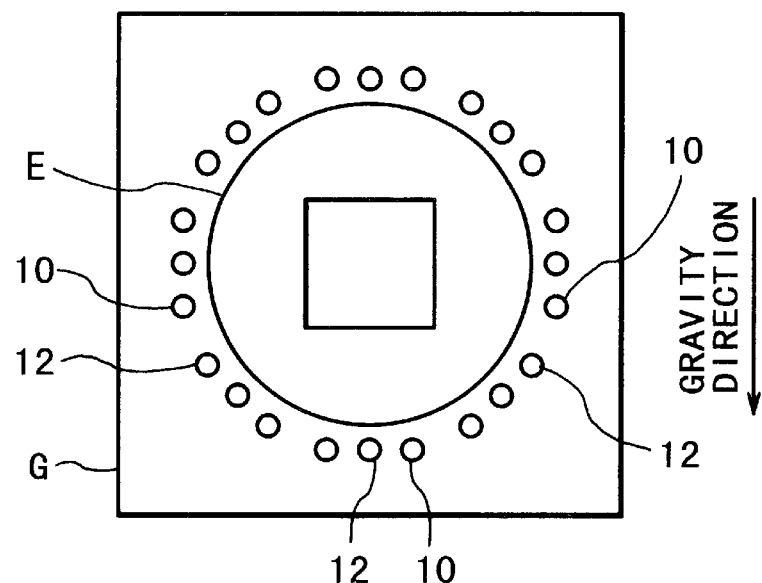
FIG. 14

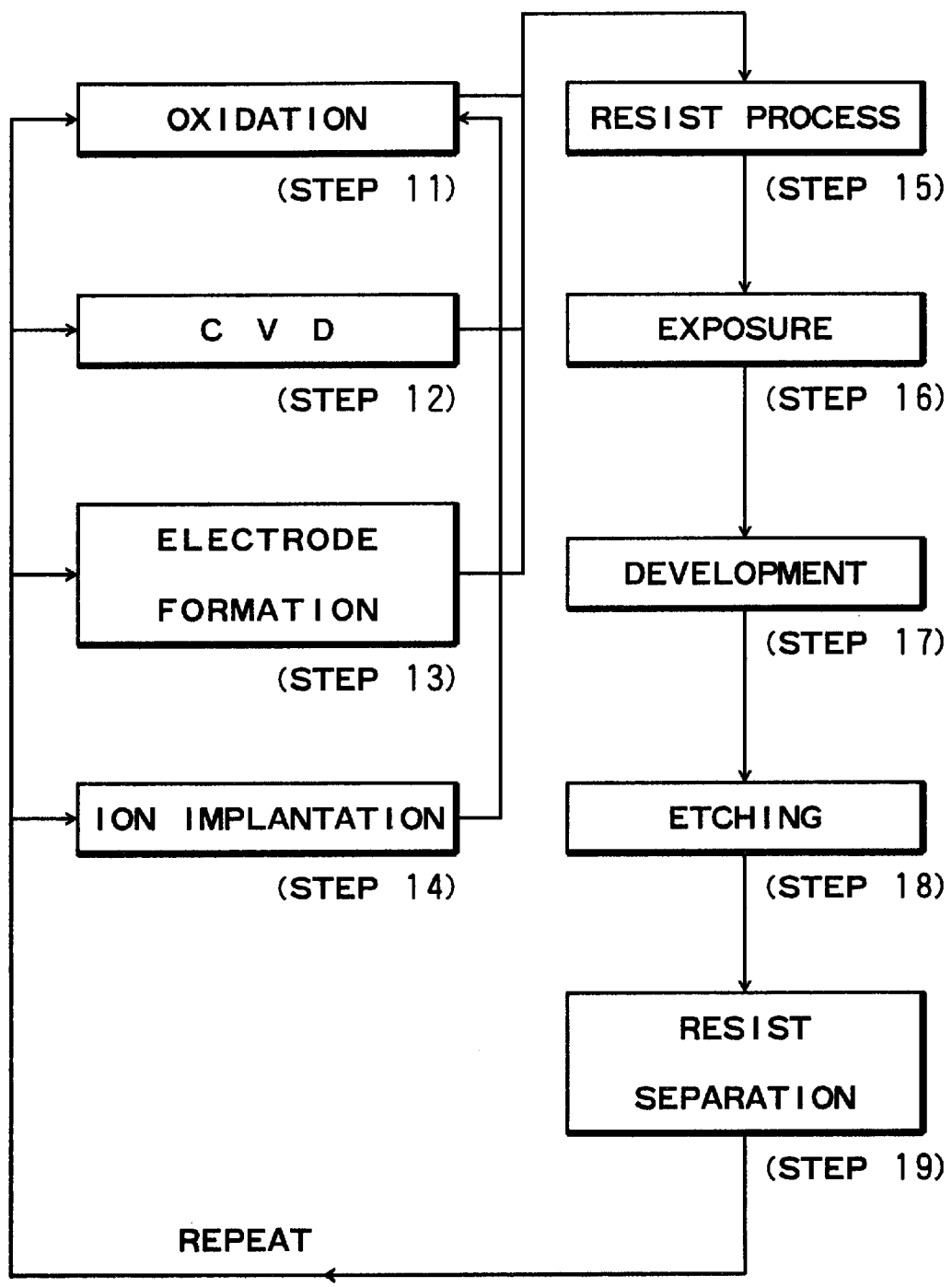
F I G. 22

X-RAY MASK STRUCTURE, AND X-RAY EXPOSURE METHOD AND APPARATUS USING THE SAME

FIELD OF THE INVENTION AND RELATED ART

This invention relates to an X-ray mask structure, an X-ray exposure method using an X-ray mask structure or an X-ray exposure apparatus, and a device manufacturing method using an X-ray mask structure or an X-ray exposure apparatus.

Due to increasing density and speed of semiconductor integrated circuits, the linewidth of a pattern for integrated circuits is becoming smaller and smaller. Improved performance of semiconductor manufacturing methods is thereby required. In order to meet this need, printing apparatuses, such as steppers using shorter wavelengths, such as KrF lasers (248 nm), ArF lasers (193 nm), and X-ray regions (0.2–15 nm) have been developed.

Also, as regards a resist material to be used for transfer of a desired pattern to a workpiece, a chemical amplification type resist using acid catalyst has been used.

On the other hand, because of decreasing linewidth of a pattern desired, dust protection becomes difficult to accomplish. While the limit for particle size or particle number becomes very strict as a matter of course, also the sensitivity to chemical matters is increasing. Thus, in a clean room for production of semiconductor integrated circuits, chemical contamination is a problem.

The contamination is caused by matters such as those produced by resist decomposition, dispersed matters produced during processes such as development and cleaning, or volatile matters attributable to equipments such as wall material or adhesive agents. If exposure with high-energy X-rays is performed in such an environment for a long period, due to contamination of the surface of a mask, i.e., deposits of materials thereon, the X-ray transmission factor, reflection factor, or scattering will change. Particularly, when a chemical amplification type resist is used, acid is produced, and acid or decomposed material may be evaporated during or after the exposure process, which accelerates contamination of the mask.

FIG. 1 illustrates an example of reaction of a chemical amplification type resist. A material of t-Boc (tetra-butoxy carbonyl styrene) contained in the resist as an anti-solution agent may be decomposed into volatile butene.

Further, since in X-ray projection exposure the exposure process is performed while a mask and a workpiece (wafer) are held with a small gap of about several tens of microns or less, contamination of the mask causes a critical problem. Deposits may have various shapes and compositions. While there may be some dependence upon the environment, details are not clear. It may be considered that the deposits are caused not solely by simple opto-chemical reaction, but by a complicated combination of decomposition, recombination, multiple-order reaction, accumulation and crystallization. Furthermore, since in an X-ray mask the absorptive material used has a high aspect, it is difficult to clean the mask completely. There may remain particles not removed by the cleaning. Also, since the supporting film used is very thin, its strength is very low. Therefore, the cleaning operation can not be performed many times.

Inside the exposure apparatus, contamination of components will cause adverse influence to the performance.

SUMMARY OF THE INVENTION

It is an object of the present invention to provide a novel and improved X-ray mask structure or X-ray exposure apparatus by which at least one of the problems described above can be solved or reduced.

It is another object of the present invention to provide an X-ray exposure apparatus using such an X-ray mask structure, or an X-ray exposure method using such an X-ray exposure apparatus.

It is another object of the present invention to provide a device manufacturing method using such an X-ray mask structure or X-ray exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 13A and 13B are schematic views, respectively, for explaining exposure sequence in an X-ray exposure apparatus according to an embodiment of the present invention.

FIG. 14 is a schematic view of an X-ray mask structure and a mask chuck according to a further embodiment of the present invention.

FIG. 22 is a flow chart for explaining details of a wafer process in the semiconductor device manufacturing procedure of FIG. 21.

DESCRIPTION OF THE PREFERRED EMBODIMENTS

Figure 1:
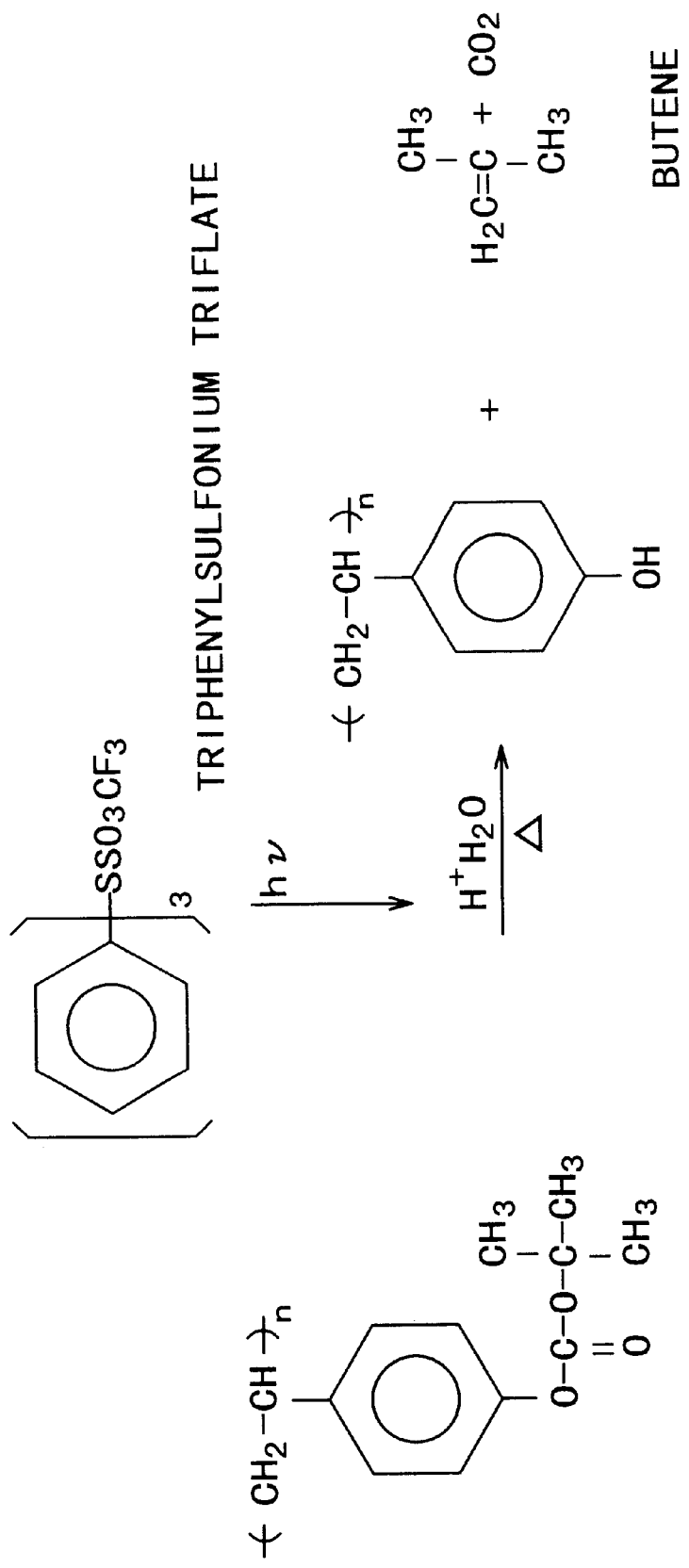
FIG. 1 is a schematic view for explaining an example reaction of a chemical amplification type resist.

In accordance with some embodiments of the present invention to be described below, a suction port is provided so that dust or particles such as organic matters or metal dust, for example, are discharged outwardly from the suction port, while on the other hand a fresh gas is supplied from a supply port, by which adhesion of dust to an exposure region on a mask can be prevented or reduced.

Acid is produced or acid and decomposed matters are produced from a chemical amplification resist after the exposure process. Since, however, the exposure time is only about one second, for most of the period the region of the mask to be used for the exposure process is kept opposed to unexposed portions of a workpiece. Therefore, by evacuating through a suction port the portion close to the mask region to be used for the exposure, almost all the dust (acid producer or acid and decomposed matter) produced form the resist can be discharged. Adhesion of dust to the exposure region can thereby be prevented.

Evacuation may be made through a suction port provided at the bottom side. This is effective to prevent a pressure difference between the top and bottom faces of a supporting film (thin film) of a mask, and to keep the flatness of the supporting film. Creation of pressure difference can be prevented by supplying a fresh gas from a supply port, while evacuation is made through a suction port. This effectively avoids adverse influence to the gap of a few tens microns between the workpiece (wafer) and the mask. Even in cases where the suction portion is provided at the top face only, the flatness may be held by adjusting the evacuation or discharging quantity so that the pressure difference is kept at 1 Pa or lower.

In addition to prevention of adhesion of dust to the mask, adhesion of dust to the X-ray exposure apparatus can be avoided. This assures stability of X-ray exposure.

In regard to deposition of organic matters remaining, if any, an air or oxygen may be introduced through a supply port (which may be provided in an X-ray mask structure or a member which supports the mask structure or, alternatively, which may be defined outside it) and ultraviolet rays may be projected to produce $O_3$, with which $UV/O_3$ cleaning may be performed. More specifically, with the irradiation of ultraviolet light of 185 nm or shorter, oxygen may be transformed into $O_3$, and with the irradiation of ultraviolet light of 254 nm or shorter, $O_3$ may be transformed into activated oxygen by which organic matters can be decomposed As an alternative, oxygen may be introduced through a supply port, and oxygen plasma may be produced between an electrode and another electrode which supports the mask structure, whereby oxygen plasma cleaning may be performed. This may further reduce dust deposition.

During the exposure procedure, an exposure process for transferring a desired pattern of a mask onto a workpiece and a mask cleaning process for cleaning the mask structure with $UV/O_3$ cleaning may be performed repeatedly. This may further reduce dust deposition or prevent it As regards cleaning to be performed in an exposure chamber, not only contamination of the mask but also contamination inside the exposure apparatus can be cleaned.

There may be a cleaning unit for accommodating a mask structure, separately from a mask cassette chamber, which may be provided with a suction port and a supply port. Contamination of the mask may be monitored and, when a certain level is reached, the mask may be moved into the unit. Air or oxygen may be introduced through the supply port, and ultraviolet light may be projected to the mask structure, to perform $UV/O_3$ cleaning. In that occasion, the unit may be controlled separately from the exposure ambience, and decomposed matters may be discharged outwardly from the suction port to prevent re-adhesion. This is effective to increase the efficiency of decomposition of adhered matters. In a similar structure, $UV/O_3$ cleaning may be replaced by oxygen plasma cleaning.

In an exposure apparatus having a mask cassette chamber for keeping the mask when an exposure process for workpieces is not performed, the mask cassette chamber may be used in combination with, or in place of, the aforementioned unit for cleaning the mask. This enables mask cleaning during nonuse of the mask, and accomplishes prevention of mask contamination.

In accordance with an X-ray exposure method and an X-ray exposure apparatus of the present invention, high-precision and mass-production printing is enabled. The Stray mask structure, the X-ray exposure method and the X-ray exposure apparatus may be either transmission type or reflection type.

Preferred embodiments of the present invention will be described below with reference to the accompanying drawings.

[Embodiment 1]

FIGS. 2(a)–2(d) show an X-ray mask structure and a mask chuck, according to a first embodiment of the present invention.

Figure 2A:
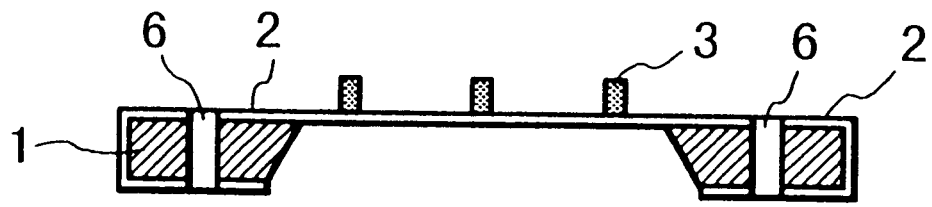
FIGS. 2(a), 2(b) and 2(c) are sectional views, respectively, of examples of an X-ray mask structure according to a first embodiment of the present invention.
Figure 2B:
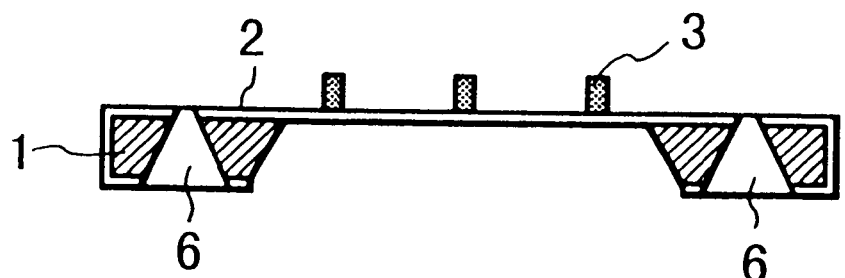

The X-ray mask structure comprises a holding frame 1 made of Si and having a thickness 2 mm, a supporting film 2 of SiC having X-ray transmissivity and being made by CVD with a thickness 2.0 microns, and an X-ray absorptive material 3 of Ta. The holding frame 1 is formed with suction ports 6. In the case where the suction port 6 has a shape such as shown in FIG. 2(a), a mask chuck 7 for holding the X-ray mask structure inside an X-ray exposure apparatus may be provided with suction ports 8 (FIG. 2(d)) being communicated with evacuation means such as a pump. The evacuation capacity may be adjusted to a level not disturbing the flatness of the supporting film 2 or the ambience inside the exposure apparatus. In a modified form, the suction port 6 may be formed by anisotropic etching of Si and it may have taper such as shown in FIG. 2(b).

Figure 2C:
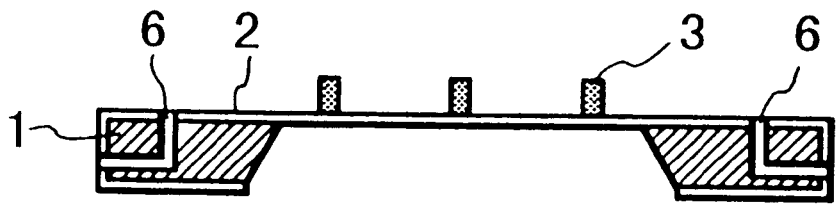
Figure 2D:
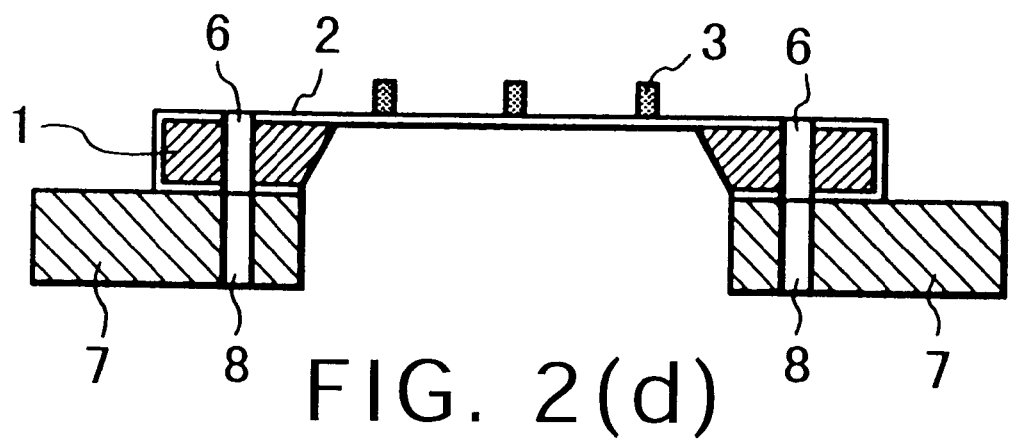
FIG. 2(d) is a sectional view of an X-ray mask structure as mounted on a mask chuck.

The suction port nay have a shape such as shown in FIG. 2(c), and it may be connected to evacuation means directly.

With the provision of suction ports for discharging dust or decomposed matters therethrough, contamination of the mask surface can be prevented or reduced and the times of cleaning operations can be reduced. This enables prolongation of the lifetime of the mask.

[Embodiment 2]

Figure 3A:
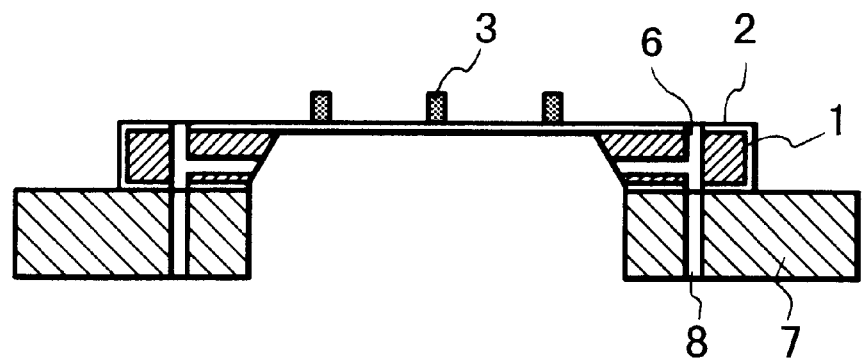
FIG. 3A is a sectional view of an X-ray mask structure as mounted on a mask chuck, according to another embodiment of the present invention.

FIG. 3A is a sectional view of an X-ray mask structure and a mask chuck, according to a second Embodiment of the present invention.

The X-ray mask structure is similar to that of the first embodiment, but there are additional suction ports at the bottom face. With the evacuation from the bottom suction ports, there is no pressure difference created between the top surface and bottom surface of the mask supporting film 2 (thin film). Thus, the flatness of the supporting film can be maintained easily, and the evacuation capacity can be enlarged.

Use of the mask having suction ports 8 as described enables prevention of contamination of the mask surface and reduction in number of cleaning operations required. This effectively prolongs the lifetime of the mask. Thus, an X-ray mask structure which can meet mass-production is accomplished.

[Embodiment 3]

Figure 3B:
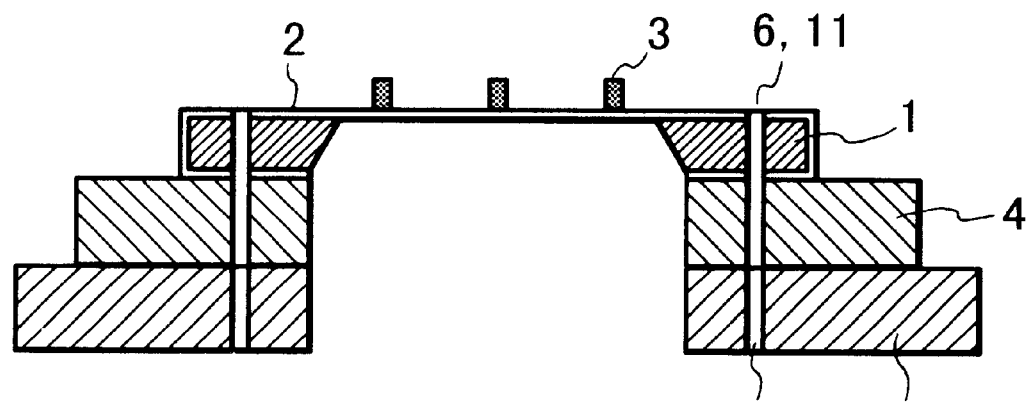
FIGS. 3B and 3C are sectional views, respectively, of an X-ray mask structure as mounted on a mask chuck, according to a further embodiment of the present invention
Figure 3C:
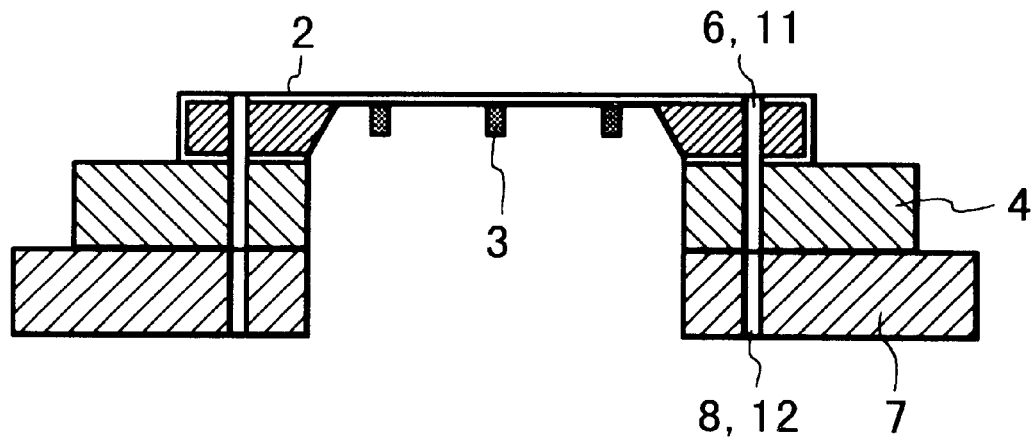

FIGS. 3B and 3C show an X-ray mask structure according to a third embodiment of the present invention.

The X-ray mask structure comprises a holding frame 1 made of Si and having a thickness of 2 mm, a supporting film 2 of SiC having X-ray transmissivity and being made by CVD with a thickness of 2.0 microns, an X-ray absorptive material 3 of Ta, and a reinforcing member 4 of Pyrex glass being adhered to the holding frame 1 through anodic bonding.

The X-ray mask structure is held by a mask chuck 7 inside an X-ray exposure apparatus. There are suction ports 6 and supply ports 11 extending through the holding frame 1 and the reinforcing member 4. The mask chuck 7 for holding the X-ray mask structure inside the exposure apparatus is formed with suction ports 8 and supply ports 12 being communicated with evacuation means such as a pump or an equipment for supplying fresh gases. The evacuation capacity and gas supply quantity may be adjusted to a level not disturbing the flatness of the supporting film 2 or the ambience inside the exposure apparatus. There may be a suction port 6 at the bottom face side as in the second embodiment.

The X-ray absorptive material 3 may be formed on the workpiece side as shown in FIG. 3B, or it may be formed at the opposite side as shown in FIG. 3C. In the case of FIG. 3C, production of the mask is relatively difficult, but the cleaning of dust adhered on the mask's exposure region is relatively easy.

With the provision of suction ports for discharging dust or decomposed matters therethrough, contamination of the mask surface can be prevented or reduced and the times of cleaning operations can be reduced. This enables prolongation of the lifetime of the mask.

[Embodiment 4]

Figure 4:
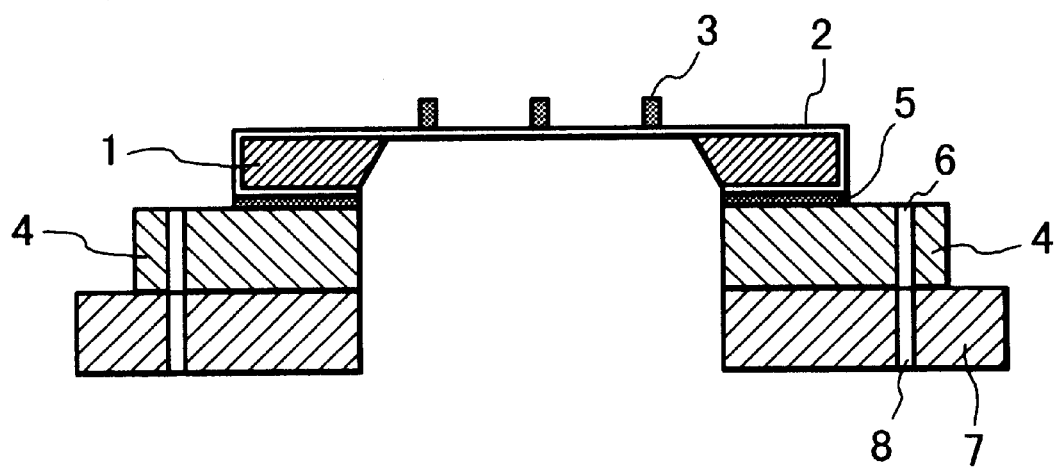
FIGS. 4, 5, 6 and 7 are sectional views, respectively, of X-ray mask structures mounted on mask chucks, according to further embodiments of the present invention.

FIG. 4 is a sectional view of an X-ray mask structure and a mask chuck, according to a fourth embodiment of the present invention The X-ray mask structure comprises a holding frame 1 made of Si and having a thickness of 0.625 mm, a supporting film 2 of SiN having X-ray transmissivity and being made by CVD with a thickness of 2.0 microns, an X-ray absorptive material 3 of W formed by sputtering, and a reinforcing member 4 of SiC adhered to the holding frame 1 by an adhesive agent 5. The reinforcing member 4 of the X-ray mask structure is formed with suction ports 6. Also, the mask chuck 7 is formed with suction ports 8. Dust adhesion to, or contamination of, the mask can be prevented with this structure.

[Embodiment 5]

Figure 5:
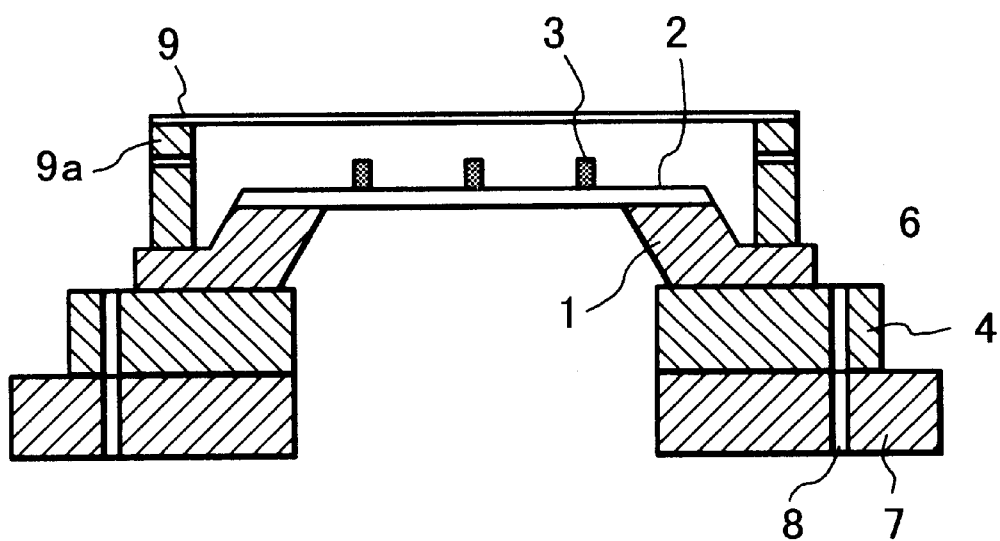

FIG. 5 is a sectional view of an X-ray mask structure and a mask chuck, according to a fifth embodiment of the present invention.

The X-ray mask structure is similar to that of the fourth embodiment, but the peripheral portion of the holding frame 1 is made to slant by polishing. At this slant portion of the holding frame 1, there is a pellicle frame 9a for holding a pellicle 9. Dust adhesion or contamination from the outside can be prevented by suction ports, while the exposure pattern bearing portion can be protected by the pellicle. With the provision of both the pellicle and the suction ports, dust and contamination can be avoided, and dust adhesion to the exposure region can be prevented efficiently.

[Embodiment 6]

Figure 6:
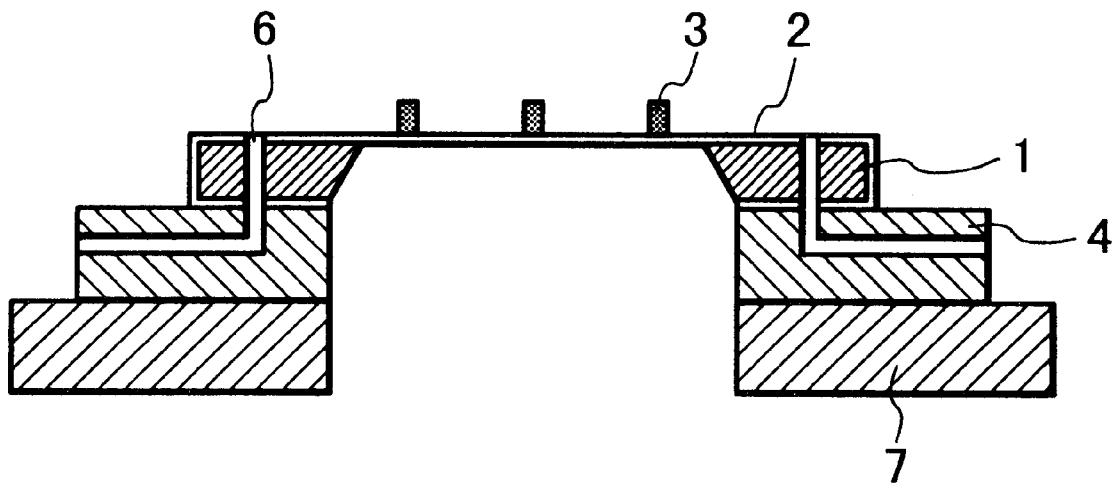

FIG. 6 is a sectional view of an X-ray mask structure and a mask chuck, according to a sixth embodiment of the present invention.

The X-ray mask structure is similar to that of the third embodiment, but the suction port 6 extending through the holding frame 1 and the reinforcing member 4 is formed such as illustrated. It may be directly connected to evacuation means. Forming the connection at the reinforcing member may be easier, as compared with a case where it is formed at the holding frame. Independently of the X-ray exposure apparatus, suction can be performed at the mask solely.

[Embodiment 7]

Figure 7:
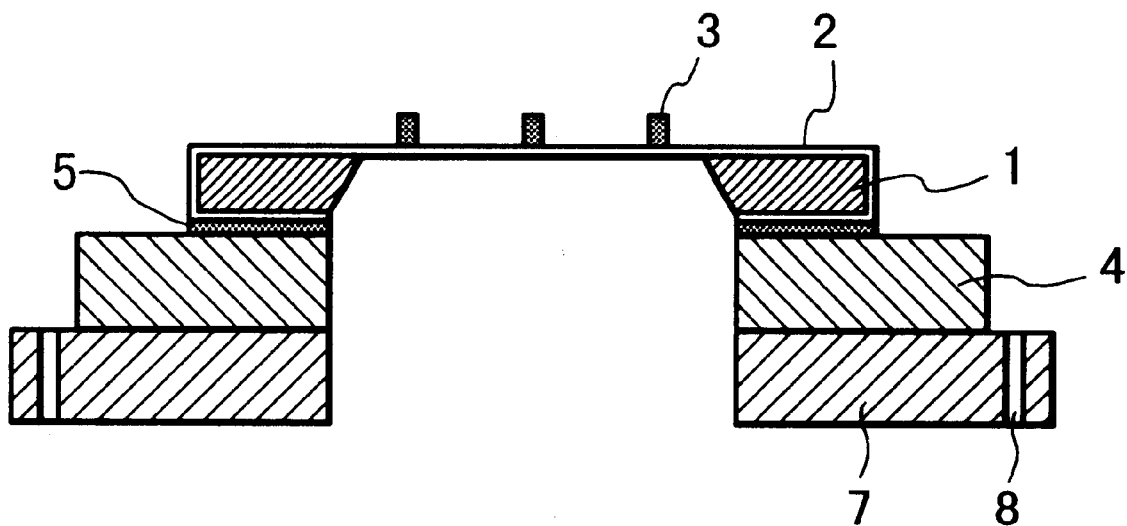

FIG. 7 is a sectional view of an X-ray mask structure and a mask chuck, according to a seventh embodiment of the present invention.

The X-ray mask structure is similar to that of the fourth embodiment, and the mask chuck is formed with suction ports 8. Regardless of the shape of the mask structure, suction may be performed at the X-ray exposure apparatus side.

[Embodiment 8]

Figure 8A:
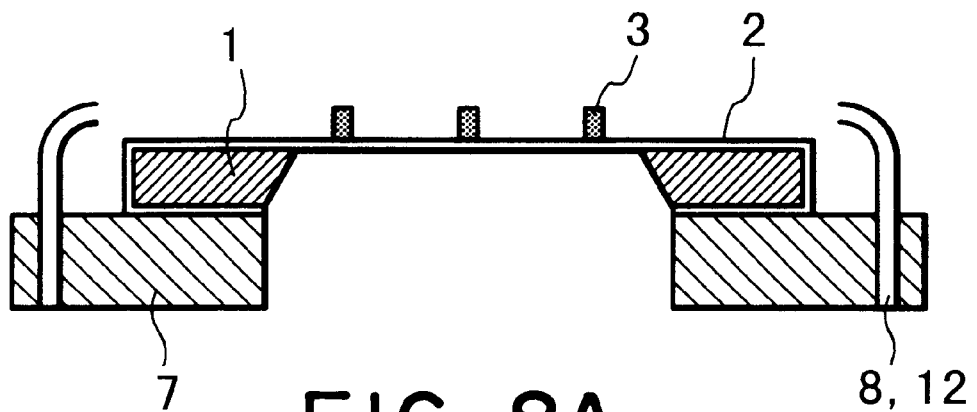
FIGS. 8A, 8B and 8C are sectional views, respectively, of examples of X-ray mask structures mounted on mask chucks according to yet other embodiments of the present invention.
Figure 8B:
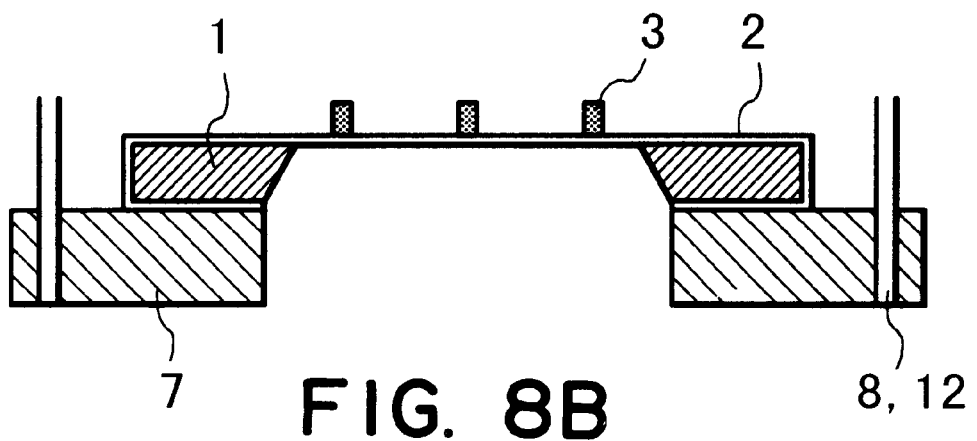
Figure 8C:
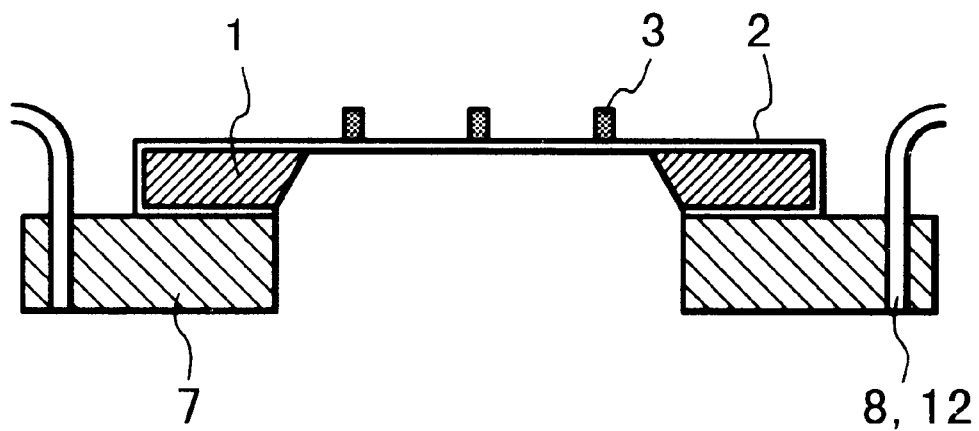

FIGS. 8A–8C are sectional views of an x-ray mask structure and a mask chuck, according to an eighth embodiment of the present invention.

The X-ray mask structure is similar to that of the first embodiment, and there are suction ports 8 and supply ports 12 formed in the mask chuck The suction port 8 and the supply port 12 may have shapes such as shown in FIGS. 8A, 8B or 8C, which are effective to perform suction at a location closer to the exposure region.

When the suction port 8 or supply port 12 faces to a side opposite to the mask, as in the example of FIG. 8C, the evacuation capacity and gas supply quantity can be enlarged without adverse effect to the flatness of the supporting film. This prevents dust adhesion to the X-ray exposure apparatus more efficiently.

[Embodiment 9]

Figure 9:
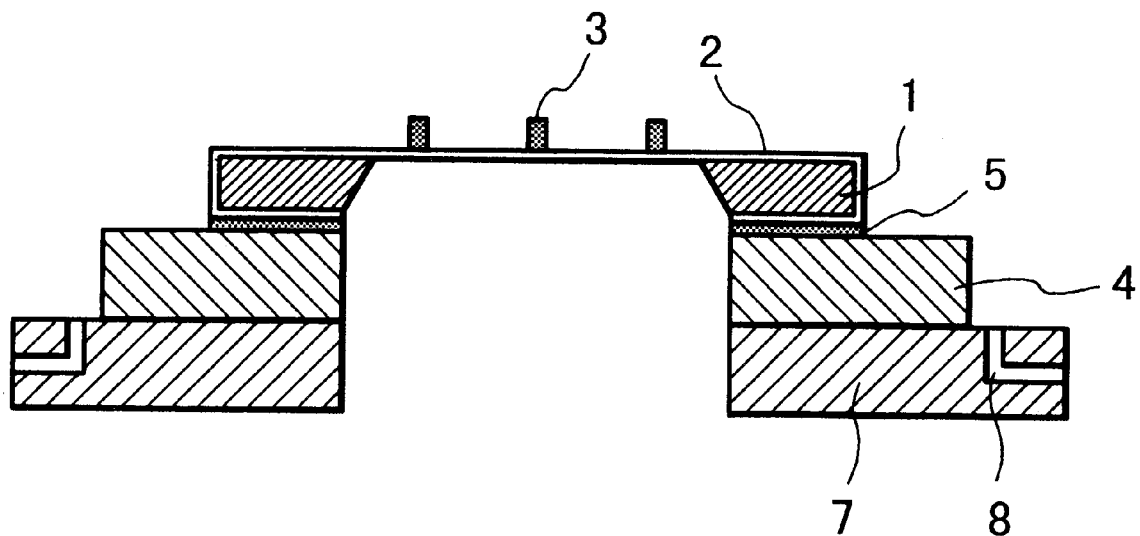
FIGS. 9 and 10 are sectional views, respectively, of X-ray mask structures mounted on mask chucks, according to still further embodiments of the present invention.

FIG. 9 is a sectional view of an X-ray mask structure and a mask chuck, according to a ninth embodiment of the present invention.

The X-ray mask structure is similar to that of the fourth embodiment, and there are suction ports 8 formed in the mask chuck. The suction port 8 may have a shape such as shown in FIG. 9, and connection to the evacuation means may be formed at the side face of the mask chuck.

[Embodiment 10]

Figure 10:
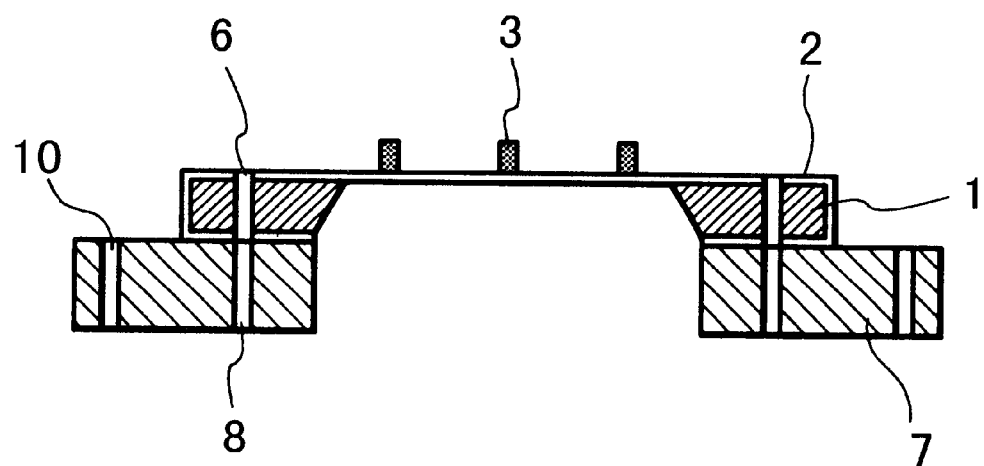

FIG. 10 is a sectional view of an X-ray mask structure and a mask chuck, according to a tenth embodiment of the present invention.

The X-ray mask structure is similar to that of the first embodiment, and it has suction ports 6. The mask chuck has suction ports 8, which are concentric with the suction ports 6, and other suction ports 10, operable to perform suction independently.

[Embodiment 11]

Next, an embodiment of an X-ray exposure apparatus, which uses a it mask and a mask chuck according to any one of the first to tenth embodiments described above for manufacture of microdevices, such as semiconductor devices, thin film magnetic heads, or micro-machines, for example, will be explained.

Figure 11:
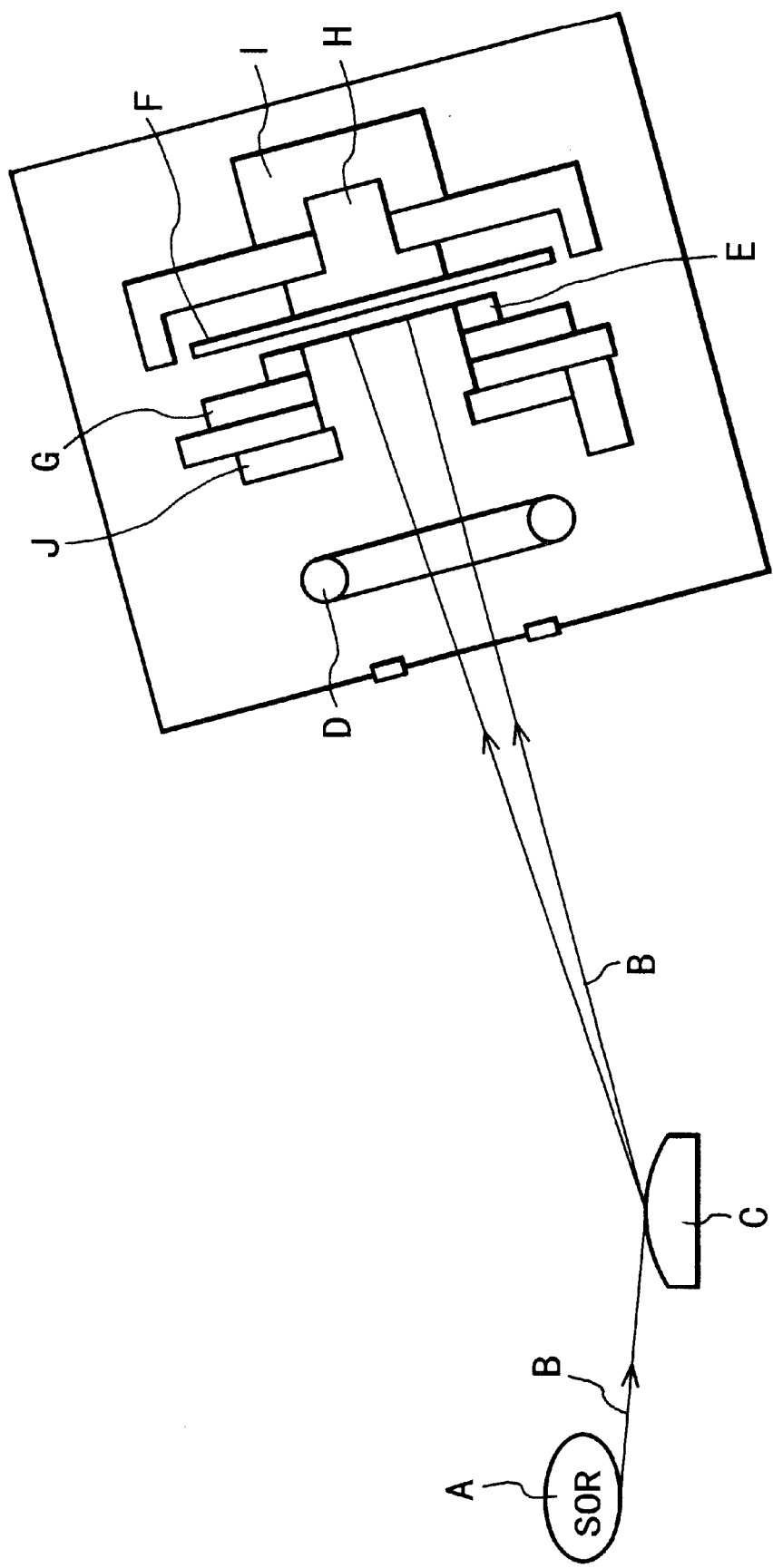
FIG. 11 is a schematic view of a general structure of an X-ray exposure apparatus using an X-ray mask structure and a mask chuck, according to an embodiment of the present invention.

FIG. 11 is a schematic view of a main portion of an exposure apparatus according to an eleventh embodiment of the present invention, which uses an X-ray mask structure.

Denoted in FIG. 11 at A is an SOR (synchrotron orbital radiation) ring. Synchrotron radiation light B emitted from the ring A has a sheet-like beam shape with its intensity being uniformly expanded in the lateral direction. The radiation light B is reflected by a cylindrical mirror C so that it is expanded in the vertical direction. By this, a beam of substantially quadrilateral shape in section is produced, and a quadrilateral exposure region can be defined. The expanded radiation light B is adjusted by means of a shutter D such that a uniform exposure amount is provided within an irradiation region. The radiation light passed through the shutter D is directed to an X-ray mask E. The X-ray mask E is attracted to a mask chuck G, and it is placed at a position opposed to a wafer F. The X-ray mask E and the mask chuck G are prepared in accordance with any one of the first to tenth embodiments described hereinbefore.

Denoted at F is a wafer which is to be exposed. The wafer F is held by a wafer chuck H which is mounted on a wafer stage I. The wafer stage I is moved for positioning the wafer F.

Alignment unit J comprises an optical system for detecting alignment marks provided on the mask E and the wafer F for positioning of them, and calculating means for calculating a deviation between them. Use of the X-ray mask E according to the present invention enables high precision alignment.

After completion of alignment of the mask E and the wafer F, a pattern formed on the X-ray mask E is transferred and printed on the wafer F in accordance with the step-and-repeat method or scanning method.

All dust materials such as organic matters or metals can be discharged through suction ports (not shown) and a fresh gas can be supplied through supply ports (not shown), by which adhesion of dust to the mask or the exposure apparatus can be prevented. Further, since dust matters created from a resist can be evacuated sufficiently without disturbing the flatness of the supporting film of the mask, evacuation and supply of fresh gas may be performed after sufficiently separating the mask from the wafer in response to completion of one-step exposure.

This structure enables high precision X-ray exposure that can meet mass-production.

[Embodiment 12]

An X-ray exposure apparatus according to another embodiment of the present invention will now be described.

Figure 12A:
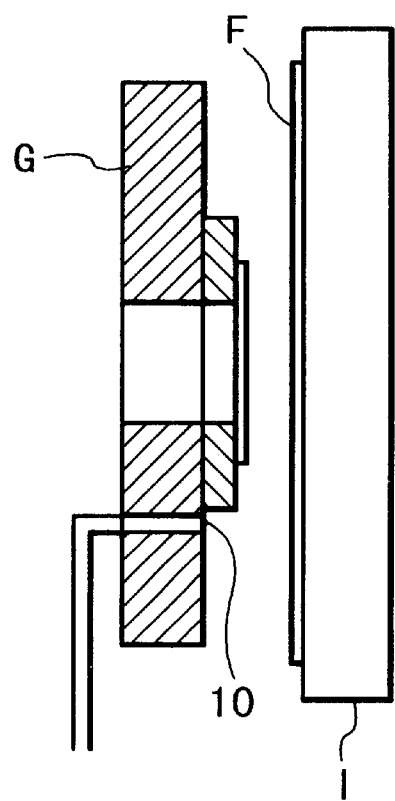
FIGS. 12A and 12B are schematic views, respectively, of a portion of an X-ray exposure apparatus according to an embodiment of the present invention.
Figure 12B:
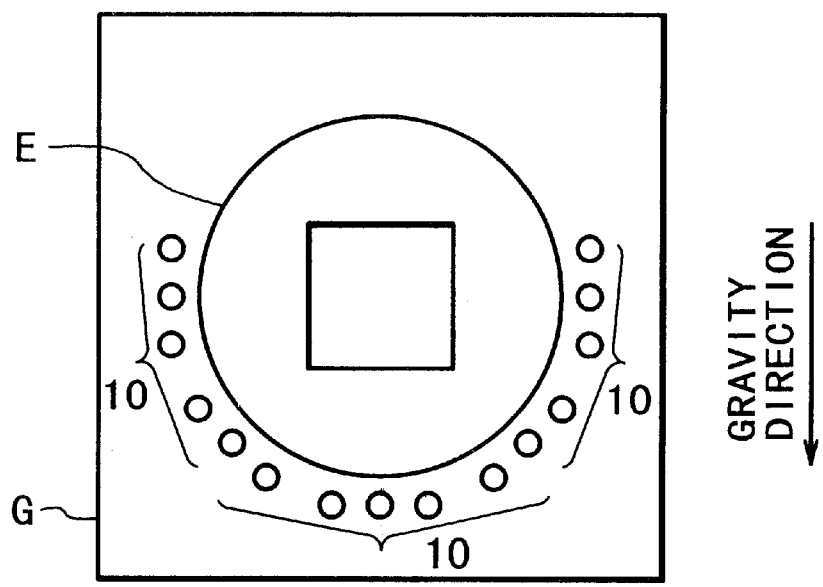

FIG. 12A is a schematic sectional view of the mask and wafer portion of an X-ray exposure apparatus according to a twelfth embodiment of the present invention. FIG. 12B is a front view of the mask, as viewed from the wafer side. FIGS. 13A and 13B are schematic views for explaining the procedure of a step-and-repeat process upon a wafer.

Denoted in these drawings at 10 are suction ports, and the direction backwardly from the sheet of the drawing corresponds to the gravity direction. As shown in FIG. 12B, there are a certain number of suction ports 10 which are disposed at the left-hand and right-hand sides of the peripheral portion of the mask structure and at the portion downwardly along the gravity direction. While in this example the suction ports are formed at the peripheral portion of the mask structure, if an X-ray mask structure according to any one of the preceding embodiments is used, they may be disposed at the same position of the suction ports of the X-ray mask structure.

As shown in FIG. 12A, since the X-ray exposure apparatus generally uses synchrotron radiation as an exposure light source, the mask and the wafer are arranged and disposed vertically along the gravity direction. Further, since X-rays to be used for the exposure comprise X-rays of a relatively long wavelength, called soft X-rays, in many cases the exposure apparatus is placed in a reduced pressure ambience of helium, nitrogen or air, for example. Most of the matters, including butene, which are emitted from a resist applied to a wafer into the ambience after exposure may be molecules heavier than helium, nitrogen or air. Therefore, unless the ambience is disturbed, these matters will fall downwardly. In consideration of this, in this embodiment, suction ports 10 are provided at a downstream position along the gravity direction of the exposure mask so as to promptly discharge these materials so that they are not dispersed inside the exposure apparatus. As a result, the ambience inside the exposure apparatus can be held at high purity, and in addition to this, adhesion of emitted matters to the mask is prevented.

The exposure apparatus of this embodiment may have an algorithm in which a wafer is exposed in an order from the downstream side of the gravity direction, such as illustrated in FIGS. 13A or 13B. This is effective to prevent contact of matters, emitted from the resist after being exposed, to the mask. In a case where step motion such as shown in FIG. 13A or 13B is to be executed, it may be performed in accordance with an algorithm with which the ambience gas is drawn also from those suction ports, among the suction ports provided at the opposite sides of the mask, which are opposed to a pattern whose exposure has been completed. Namely, if the step motion is to be done as in FIG. 13A, when the wafer is moved stepwise rightwardly, the ambience gas may be drawn through those suction ports at the left-hand side and downstream side of the mask. If the step motion is to be done as in FIG. 13B, the effect of the present invention can be accomplished only by the provision of suction ports at the left-hand and lower sides of the mask.

In an X-ray exposure apparatus arranged so that a resist is exposed in atmosphere, depending on the matters emitted from the resist after its exposure, the matters may be heavier than or lighter than the atmosphere. In order to meet both cases, air may be blown to the mask and the wafer from an upstream position with respect to the gravity direction (down flow blowing), and air may be drawn through suction ports at a downstream position of the mask along the gravity direction. Additionally, the suction ports may be provided at an upstream position.

[Embodiment 13]

FIG. 14 is a front view of a mask portion of an exposure apparatus according to a thirteenth embodiment of the present invention, as viewed from the wafer side. Suction ports 10 and supply ports 12 are formed alternately in a portion of a mask chuck G, around the periphery of a mask E. They may be formed around the whole periphery of the mask as illustrated, or alternatively, they may be provided only in a portion of it.

[Embodiment 14]

Figure 15:
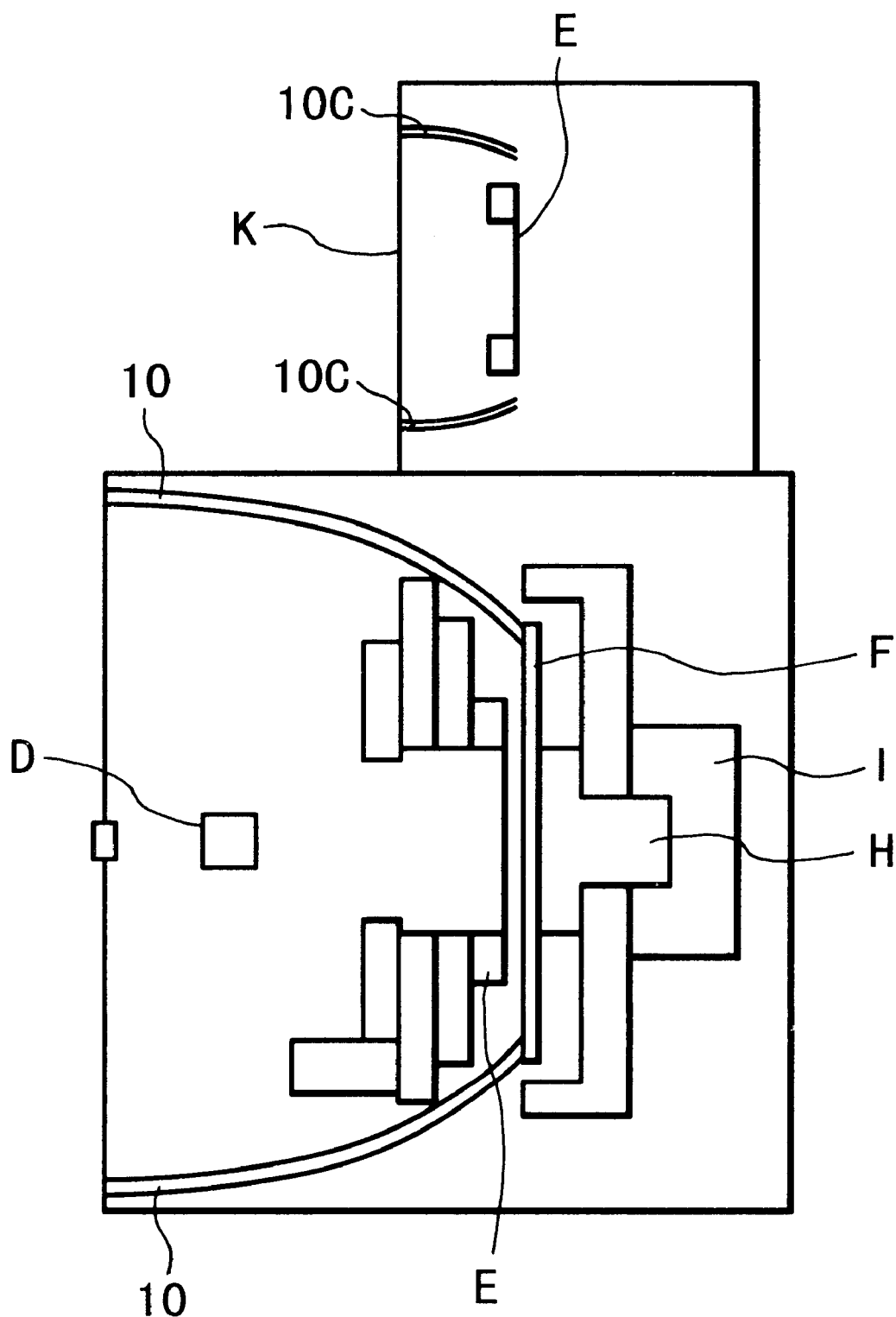
FIG. 15 is a schematic view of a general structure of an X-ray exposure apparatus according to an embodiment of the present invention.

FIG. 15 is a schematic view of a main portion of an X-ray exposure apparatus according to a fourteenth embodiment of the present invention. Like numerals as those of the preceding embodiments are assigned to corresponding elements.

The X-ray exposure apparatus has a structure similar to that of the embodiment of FIG. 11, but suction ports 10 are provided not only in a portion close to the exposure region but also in a mask cassette K (suction ports 10c) for accommodating mask structures E. This enables prevention of dust or contamination also during preservation of the mask structures.

[Embodiment 15]

Figure 16:
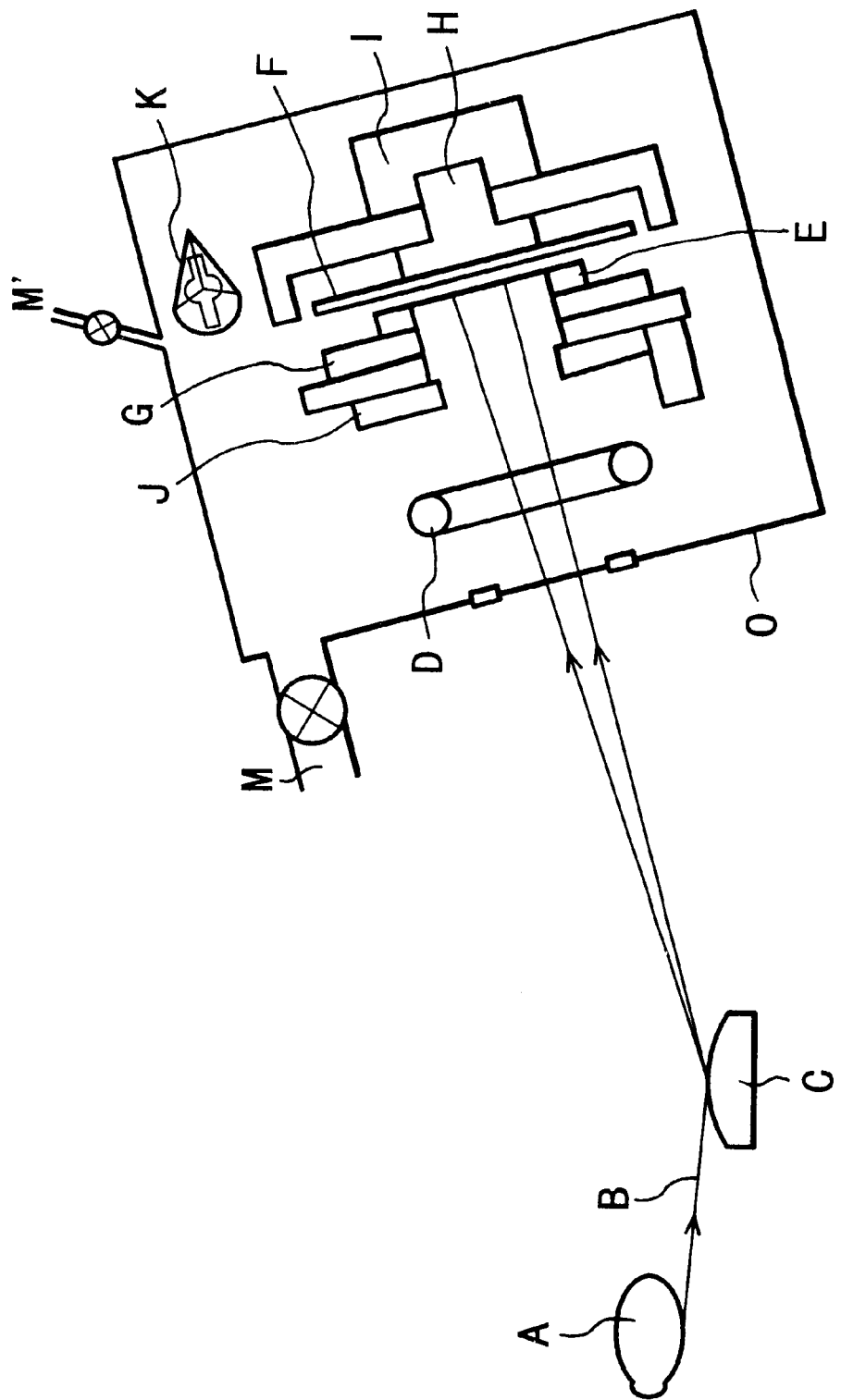
FIGS. 16, 17, 18, 19 and 20 are schematic views, respectively, of general structures of X-ray exposure apparatuses according to further embodiments of the present invention.

FIG. 16 is a schematic view of a main portion of an X-ray exposure apparatus according to a fifteenth embodiment of the present invention.

Denoted at A is a SR radiation source, and denoted at B is synchrotron radiation light. Denoted at C is a convex surface mirror, and denoted at D is a shutter. Denoted at E is an X-ray mask. Denoted at F is a wafer, and denoted at G is a mask stage. Denoted at H is a wafer chuck, and denoted at J is an alignment unit. Denoted at K is an auxiliary light source inside an exposure chamber O. Denoted at M is an evacuation port, and denoted at M' is a supply port.

The structure of the X-ray exposure apparatus is similar to that of the FIG. 11 embodiment, but there is an auxiliary light source K so that not only the mask but also the mask stage inside the exposure apparatus, for example, can be illuminated. The auxiliary light source K may comprise a lamp or laser which can emit wavelength not longer than 185 nm. The mask and the mask supporting member may be provided with supply ports and suction ports (not shown) which are communicated with the supply port M' and suction port M of the exposure chamber, respectively.

Through the supply port M', oxygen or air can be supplied into the exposure chamber O, and, in response to irradiation of ultraviolet rays, $UV/O_3$ cleaning can be performed to any organic deposits on the mask or inside the exposure apparatus. With the provision of the suction port M, decomposed matters of the deposited materials can be discharged outwardly such that the re-deposit of intermediate products of decomposed matters can be prevented.

In place of using an auxiliary light source of lamp or laser of 185 nm or shorter, $O_3$ gas may be directly introduced through the supply port.

By using an X-ray exposure apparatus wherein the mask can be cleaned in accordance with a $UV/O_3$ cleaning procedure, a high precision exposure process that can meet mass production is accomplished.

[Embodiment 16]

Figure 17:
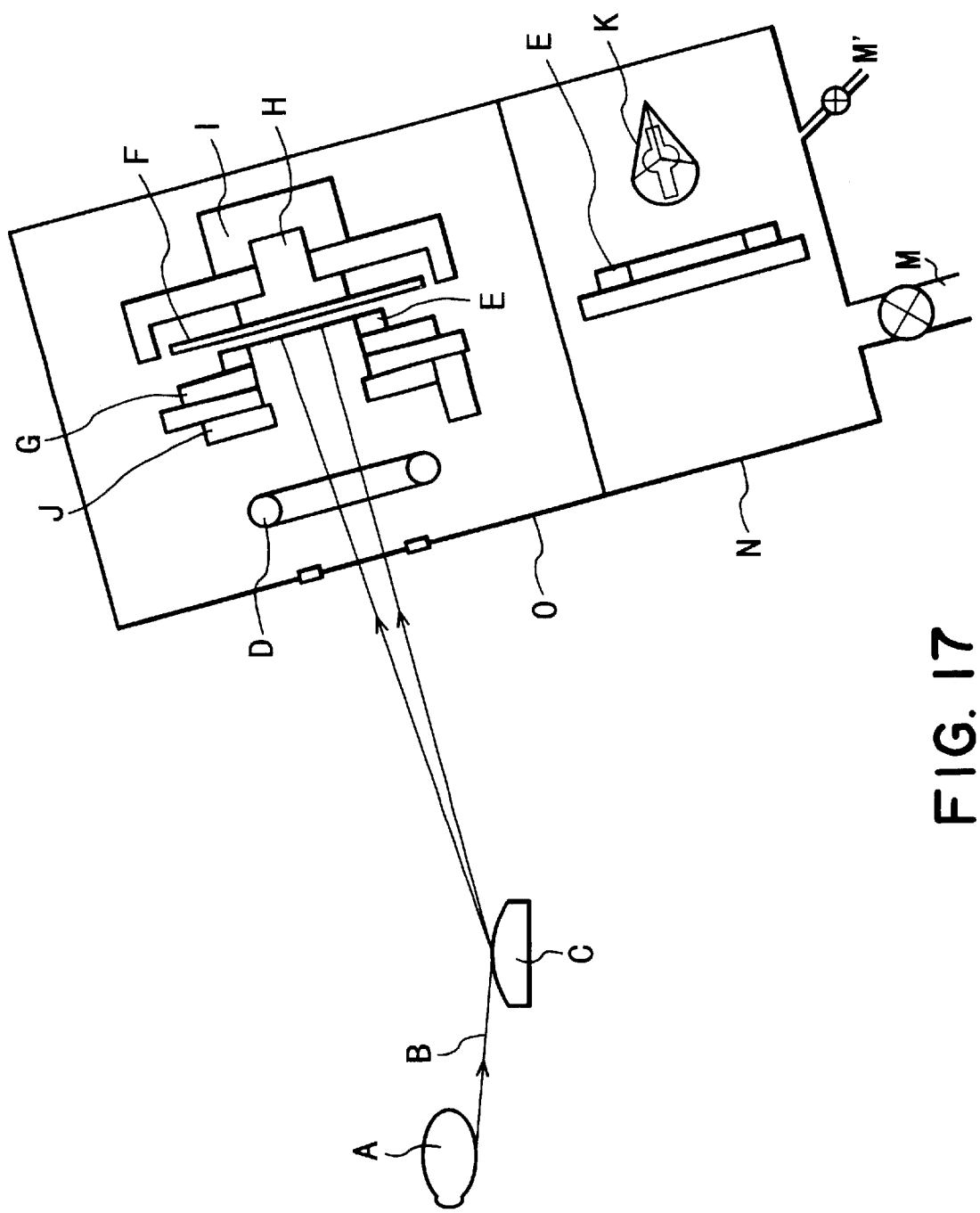

FIG. 17 is a schematic view of a main portion of an X-ray exposure apparatus according to a sixteenth embodiment of the present invention.

The structure of the X-ray exposure apparatus is similar to that of the embodiment of FIG. 11, but there is a separate chamber (unit) N in addition to the exposure chamber O and the mask cassette (not shown). In this additional chamber N, there is an auxiliary light source K. While not shown in the drawing, there is also an additional auxiliary light source provided in the exposure chamber O, as in the fifteenth embodiment.

As the exposure process is repeated within the exposure chamber O, the X-ray transmission factor or transmission factor to alignment light may be decreased due to adhesion of any matters, the exposure operation may be discontinued and the mask E may be moved into the unit N. Through the supply port M', oxygen or airs may be introduced into the unit N and ultraviolet light is irradiated. In response, $UV/O_3$ cleaning can be performed to organic deposition matters on the mask. The mask and the mask supporting member may be provided with supply ports and suction ports being communicated with the supply port M' and suction port M of the unit N.

In accordance with an X-ray exposure apparatus having a unit N for performing $UV/O_3$ cleaning as described above, high precision X-ray exposure that can meet mass production is accomplished.

[Embodiment 17]

Figure 18:
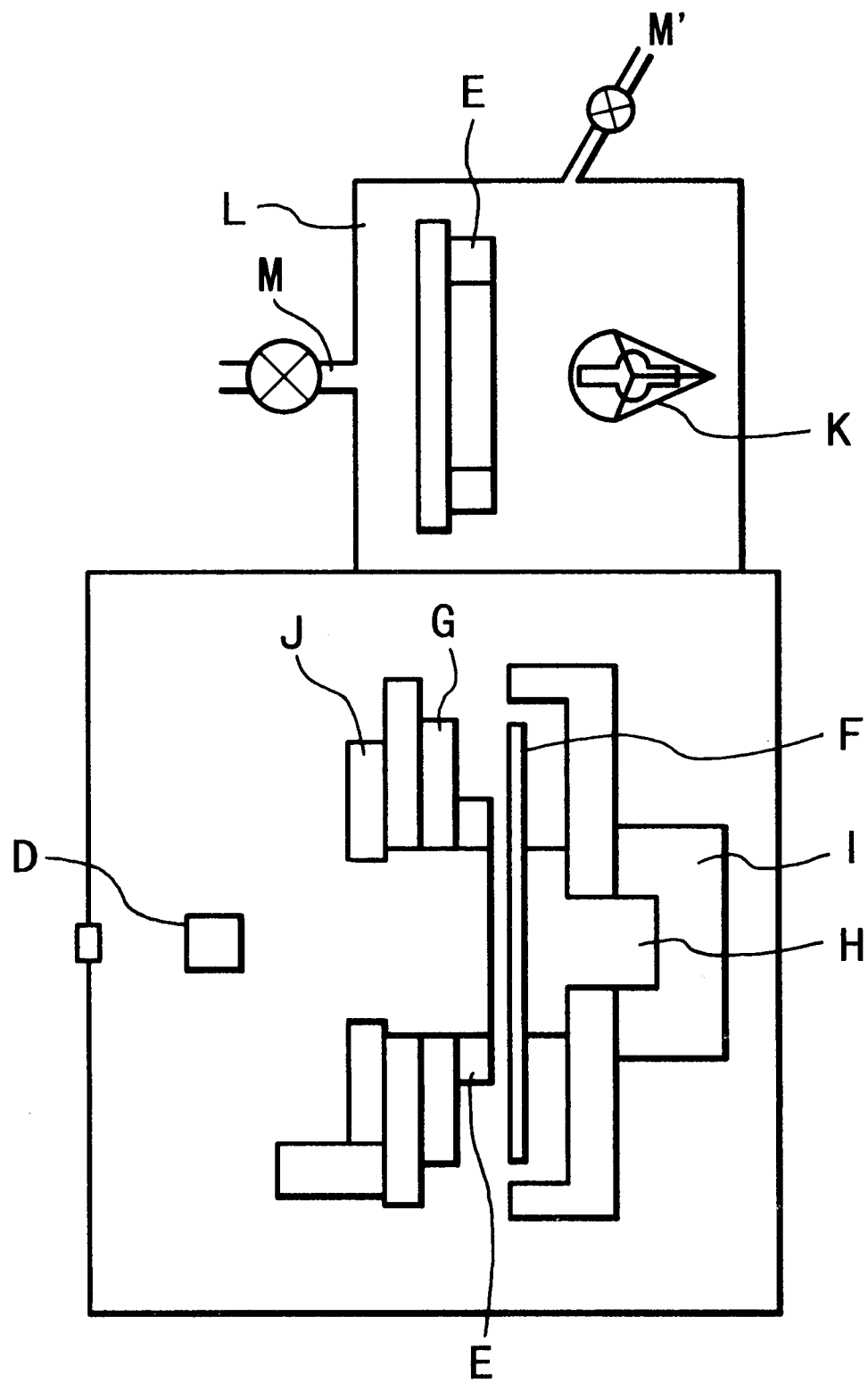

FIG. 18 is a schematic top view of a main portion of an X-ray exposure apparatus according to a seventeenth embodiment of the present invention.

The structure of the X-ray exposure apparatus is similar to that of the embodiment of FIG. 11, but there is an auxiliary light source K disposed in a mask cassette chamber L.

For masks under preservation, oxygen or air may be supplied into the mask cassette chamber L through the supply port M'. In response to irradiation of ultraviolet light, $UV/O_3$ cleaning is performed on organic matters deposited on the mask. The mask and the mask supporting member may be provided with supply ports and suction ports concentric with the supply port and suction port of the mask cassette chamber L, respectively.

In accordance with an X-ray exposure apparatus wherein $UV/O_3$ cleaning of a mask can be performed in the mask cassette chamber L, such as described above, high precision X-ray exposure that can meet mass production is accomplished.

[Embodiment 18]

Figure 19:
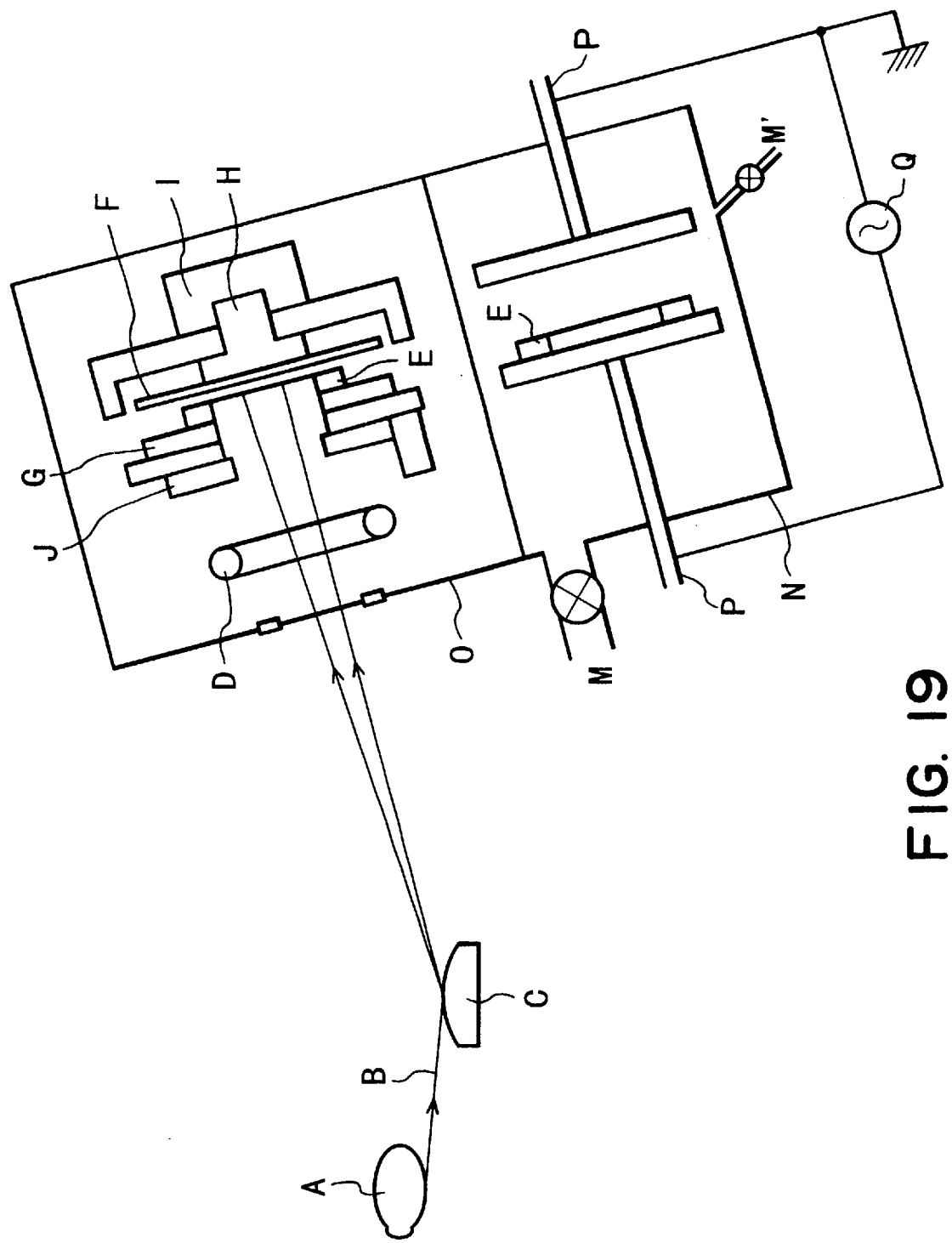

FIG. 19 is a schematic view of a main portion of an X-ray exposure apparatus according to an eighteenth embodiment of the present invention.

The structure of the X-ray exposure apparatus is similar to that of FIG. 11, but, like the sixteenth embodiment, there is a chamber (unit) N in addition to the exposure chamber O and the mask cassette (not shown).

Disposed in the unit N are opposed electrodes P, wherein the X-ray mask is disposed at one of them. The electrodes are connected to a high frequency voltage source Q.

As the exposure process is repeated within the exposure chamber O, the X-ray transmission factor or transmission factor to alignment light may be decreased due to adhesion of any matters, the exposure operation may be discontinued and the mask E may be moved into the unit N. Through the supply port M', oxygen or air may be introduced into the unit N and, with the application of a high frequency voltage, oxygen plasma is produced therein by which organic matters deposited on the mask can be removed by ashing. The mask and the mask supporting member may be provided with supply ports and suction ports that are concentric with the supply port M' and suction port M of the unit N, respectively.

In accordance with an X-ray exposure apparatus having a unit N for performing oxygen plasma cleaning as described above, high precision X-ray exposure that can meet mass production is accomplished.

[Embodiment 19]

Figure 20:
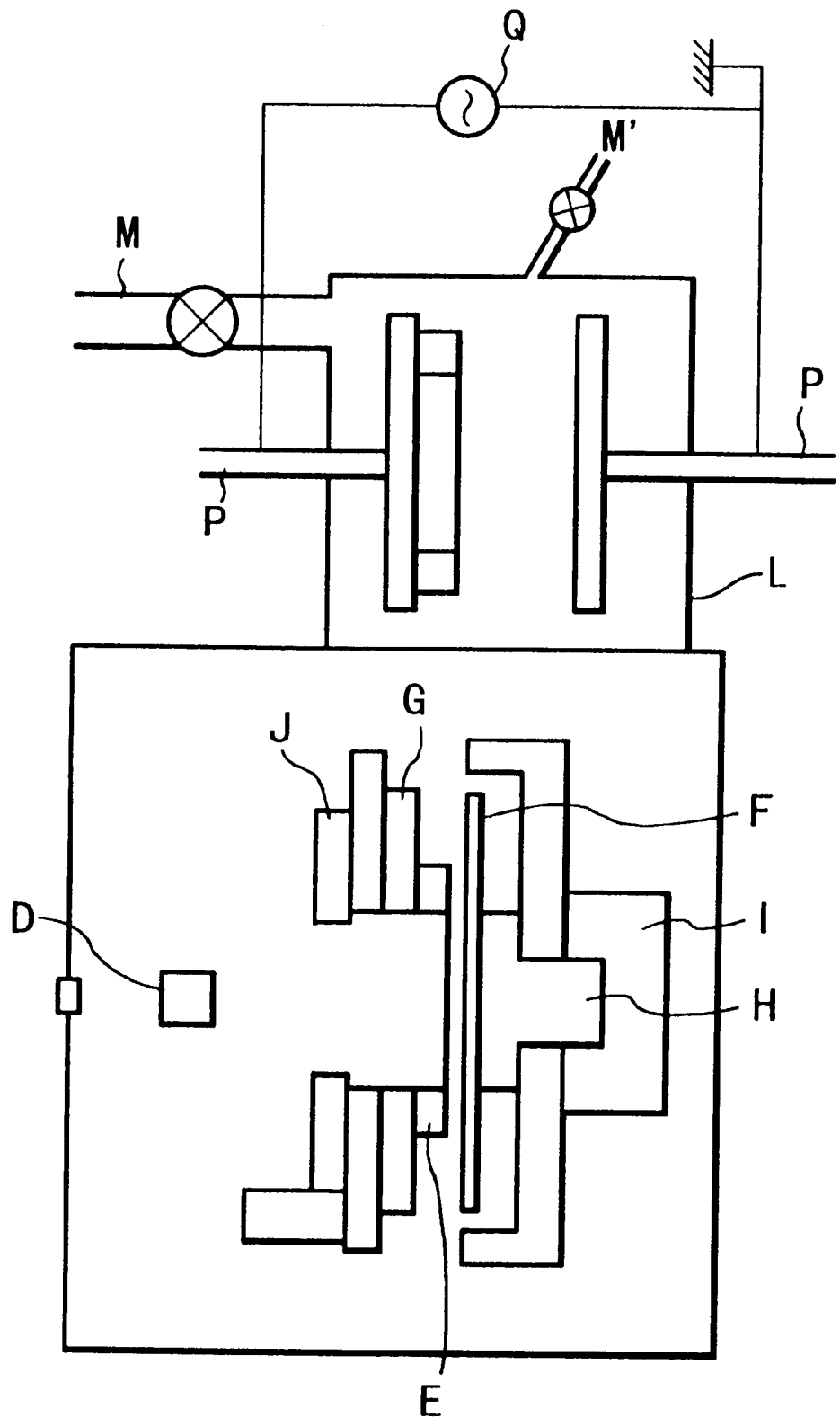

FIG. 20 is a schematic top view of a main portion of an X-ray exposure apparatus according to a seventeenth embodiment of the present invention.

The structure of the X-ray exposure apparatus is similar to that of FIG. 11, but there are opposed electrodes P disposed inside the mask cassette chamber L, wherein the mask is held at the electrode position. These electrodes are connected to a high frequency voltage source Q.

For a mask under preservation, oxygen or air may be supplied into the mask cassette chamber L through the supply port M'. In response to application of a high frequency voltage, oxygen plasma is produced so organic matters deposited on the mask can be removed by ashing. The mask and the mask supporting member may be provided with supply ports and suction ports that are concentric with the supply port and suction port of the mask cassette chamber L, respectively.

In accordance with an X-ray exposure apparatus wherein oxygen plasma cleaning of a mask can be performed in the mask cassette chamber L, such as described above, high precision X-ray exposure that can meet mass production is accomplished.

[Embodiment 20]

Next, an embodiment of a semiconductor device manufacturing method which uses an exposure apparatus according to any one of the preceding embodiments, will be explained.

Figure 21:
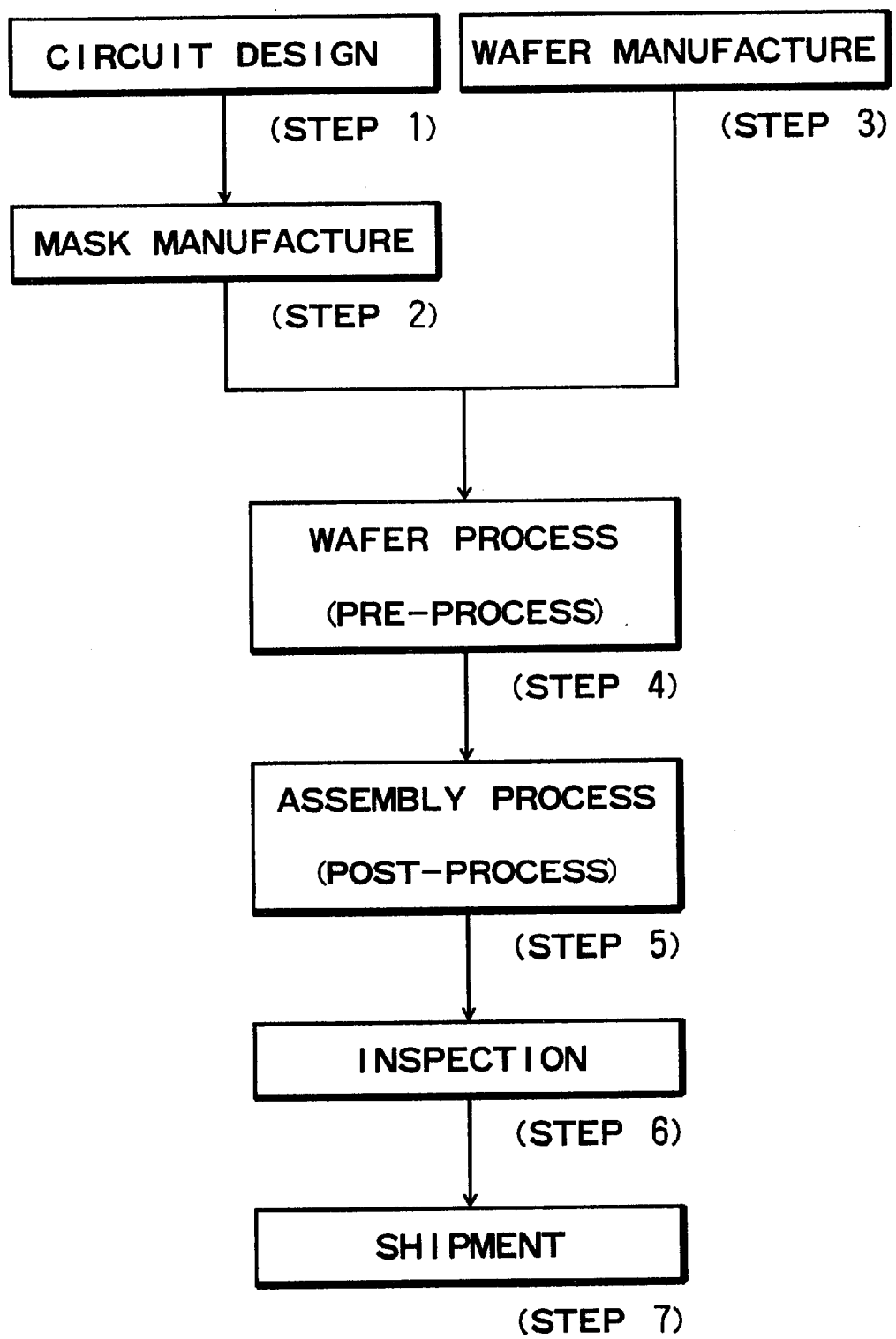
FIG. 21 is a flow chart of semiconductor device manufacturing processes to be performed in an X-ray exposure apparatus according to the present invention.

FIG. 21 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through X-ray lithography. Step 5 is an assembling step, called a post-process, wherein the wafer, having been processed by step 4, is formed into semiconductor chips. This step includes an assembling (dicing and bonding) process and a packaging (chip sealing) process. Step 6 is an inspection step that carries out an operation check, a durability check, and so on for the semiconductor devices provided by step 5. With these processes, semiconductor devices are completed and they are then shipped (step 7).

FIG. 22 is a flow chart showing details of the wafer process.

Step 11 is an oxidation process for oxidizing the surface of a wafer Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a chemical amplification type resist to the wafer. Step 16 is an exposure process for printing, by exposure, the circuit pattern of the mask on the wafer through an exposure apparatus according to any one of the eleventh to nineteenth embodiments described above A wafer is loaded and disposed opposed to a mask. Any deviation between them is detected by means of an alignment unit, and then the wafer stage is moved to perform alignment of them. After completion of alignment, exposure process is performed. After the exposure, the wafer is moved stepwise to the position for exposure of a subsequent shot, and the procedure including and following the alignment operation is repeated.

Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, suction ports are provided, either in the X-ray mask structure at positions other than the portion to be used for the exposure, or in an X-ray exposure apparatus, for outwardly discharging dust matters such as organic matters or metal matters. As a result, adhesion of dust to the mask or inside the exposure apparatus can be prevented effectively.

Use of suction ports and supply ports enables increased evacuation capacity while maintaining the flatness of a supporting film. This enhances the evacuation effect.

Discharging dust through suction ports effectively prevents contamination of the mask surface, and it leads to decreased cleaning operations and also to prolongation of lifetime of the mask. Further, the exposure stability is improved, and maintenance of exposure apparatus is made easier.

While the invention has been described with reference to the structures disclosed herein, it is not confined to the details set forth and this application is intended to cover such modifications or changes as may come within the purposes of the improvements or the scope of the following claims.

What is claimed is:

1. An X-ray mask structure detachably mountable in an X-ray exposure apparatus, said X-ray mask structure comprising:
   an X-ray absorptive material pattern;
   a supporting film for supporting the pattern;
   a holding frame for holding the supporting film; and
   a suction port arranged in said X-ray mask structure, and operable to perform gas drawing from a workpiece side to an opposite side thereto.

2. An X-ray mask structure according to claim 1, further comprising a second suction port operable to perform gas drawing at a side of the supporting film remote from the workpiece side.

3. An X-ray mask structure according to claim 1, wherein the suction port is provided in the holding frame.

4. An X-ray mask structure according to claim 1, further comprising a reinforcing member provided on the holding frame.

5. An X-ray mask structure according to claim 4, wherein the suction port is formed in the reinforcing member.

6. An X-ray mask structure according to claim 1, further comprising a pellicle and a pellicle frame for supporting the pellicle.

7. An X-ray mask structure detachably mountable in an X-ray exposure apparatus, said X-ray mask structure comprising:
   an X-ray absorptive material pattern;
   a supporting film for supporting the pattern;
   a holding frame for holding the supporting film;
   a suction port arranged in said X-ray mask structure, and arranged to be communicated with external gas drawing means; and
   a supply port through which a gas can be supplied.

8. An X-ray mask structure according to claim 7, wherein the suction port and the supply port are formed in the holding frame.

9. An X-ray mask structure according to claim 7, further comprising a reinforcing member provided on the holding frame.

10. An X-ray mask structure according to claim 9, wherein the suction port and the supply port are formed in the reinforcing member.

11. An X-ray exposure apparatus, comprising:
    a supporting member for supporting an X-ray mask structure; and
    a suction port formed in the supporting member and having a function for drawing an exposure ambient gas under a condition that said supporting member supports the X-ray mask structure.

12. An apparatus according to claim 11, wherein the suction port is provided in a portion of the supporting member surrounding an X-ray mask structure as held by the supporting member, which portion is at a position other than an upstream position with respect to a gravity direction.

13. An apparatus according to claim 11, further comprising a mask cassette for accommodating an X-ray mask structure, wherein the mask cassette has a suction port formed therein.

14. An apparatus according to claim 11, wherein, when a step-and-repeat exposure process with X-rays is performed to a workpiece by use of an X-ray mask structure as held by the supporting member, the exposure process is executed in an order from a downstream side of the workpiece with respect to the gravity direction.

15. An X-ray exposure apparatus, comprising:
a supporting member for supporting an X-ray mask structure;
a suction port formed in the supporting member and being effective to perform discharging of an exposure ambience gas; and
a supply port formed in the supporting member and having a function for drawing an exposure ambient gas under a condition that said supporting member supports the X-ray mask structure.

16. An apparatus according to claim 15, wherein, when the X-ray mask structure is supported by the supporting member, the suction port and the supply port are operable to perform gas discharging and gas supply through a bore formed in the X-ray mask structure.

17. An apparatus according to claim 15, further comprising a mask cassette for accommodating an X-ray mask structure and having a suction port and a supply port formed therein.

18. An X-ray exposure method, comprising the steps of:
holding an X-ray mask structure, wherein X-ray exposure of a workpiece can be performed by using the X-ray mask structure; and
performing exposure ambient gas drawing through a suction port formed in one of the X-ray mask structure and a supporting member for holding the X-ray mask structure, the suction port having a function for drawing an exposure ambient gas under a condition that the X-ray mask is held in said holding step.

19. A method according to claim 18, further comprising supplying a gas through a supply port formed in one of the X-ray mask structure or the supporting member for holding the X-ray mask structure.

20. A method according to claim 18, wherein the gas drawing step is executed after X-ray exposure and after separating the X-ray mask structure and a workpiece by a sufficient distance.

21. A method according to claim 18, wherein a chemical amplification type resist is used on a workpiece for X-ray exposure.

22. A device manufacturing method, comprising the steps of:
holding an X-ray mask structure, wherein X-ray exposure of a workpiece can be performed by using the X-ray mask structure;
performing exposure ambient gas drawing through a suction port formed in one of the X-ray mask structure and a supporting member for holding the X-ray mask structure; and
developing the workpiece for which the X-ray exposure has been accomplished by use of the X-ray mask structure, for production of devices.

23. A device produced in accordance with a method as recited in claim 22.

24. An X-ray exposure apparatus, comprising:
a supporting member for supporting an X-ray mask structure;
a suction port effective to perform gas drawing; and
a supply port formed in the supporting member and being effective to perform introduction of a gas therethrough containing one of oxygen and ozone, for ozone cleaning with the gas.

25. An apparatus according to claim 24, further comprising ultraviolet ray projecting means for irradiating oxygen, introduced through the supply port, with ultraviolet rays to perform ozone cleaning to the X-ray mask structure.

26. An apparatus according to claim 25, wherein the supply port, the suction port and the ultraviolet ray projecting means are disposed adjacent to an exposure position of said exposure apparatus.

27. An apparatus according to claim 25, wherein the supply port, the suction port and the ultraviolet ray projecting means are provided in a mask accommodating member.

28. An apparatus according to claim 25, wherein the supply port, the suction port and the ultraviolet ray projecting means are provided in a separate cleaning unit.

29. An apparatus according to claim 25, wherein the ultraviolet ray projecting means projects ultraviolet rays of a wavelength not greater than 185 nm.

30. An X-ray exposure apparatus, comprising:
a supporting member for supporting an X-ray mask structure;
a suction port effective to perform gas drawing; and
a supply port formed in the supporting member and being effective to perform introduction of a gas therethrough containing at least oxygen, for plasma cleaning of the X-ray mask structure with the gas.

31. An apparatus according to claim 30, wherein the supply port and the suction port are provided in a mask accommodating member.

32. An apparatus according to claim 30, wherein the supply port and the suction port are provided in a separate cleaning unit.

33. An X-ray exposure method, comprising the steps of:
performing X-ray exposure with use of an X-ray mask structure; and
introducing one of oxygen and ozone for performing ozone cleaning of the X-ray mask structure.

34. A device manufacturing method, comprising the steps of:
performing X-ray exposure of a workpiece with use of an X-ray mask structure, whereby a pattern is transferred to the workpiece:
introducing one of oxygen and ozone for performing ozone cleaning to the X-ray mask structure: and
developing the workpiece having the pattern transferred thereto through the X-ray exposure, for production of devices.

35. An X-ray exposure method, comprising the steps of:
performing X-ray exposure by use of an X-ray mask structure: and
introducing oxygen for oxygen plasma cleaning of the X-ray mask structure.

36. A device manufacturing method, comprising the steps of:
performing X-ray exposure of a workpiece by use of an X-ray mask structure, whereby a pattern is transferred to the workpiece;
introducing oxygen for oxygen plasma cleaning of the X-ray mask structure; and
developing the workpiece having the pattern transferred thereto, for production of devices.

* * * * *

UNITED STATES PATENT AND TRADEMARK OFFICE
CERTIFICATE OF CORRECTION

PATENT NO.    : 6,418,187 B1
DATED         : July 9, 2002
INVENTOR(S)   : Keiko Chiba et al.

It is certified that error appears in the above-identified patent and that said Letters Patent is hereby corrected as shown below:

Column 1,
Line 32, "equipments" should read -- equipment --.

Column 2,
Line 30, "invention" should read -- invention. --.

Column 3,
Line 18, "form" should read -- from --.
Line 39, "an" should be deleted.
Line 58, "it" should read -- it. --.

Column 4,
Line 18, "Stray" should read -- X-ray --.

Column 6,
Line 20, "x-ray" should read -- X-ray --.
Line 55, "it" should be deleted.

Column 7,
Line 48, "backwardly" should read -- backward --.

Column 9,
Line 21, "matters" should read -- matter --.
Line 23, "matters" should read -- matter --.
Line 48, "airs" should read -- air --.

Column 10,
Line 25, "matters," should read -- matter, --.
Line 28, "matters" should read -- matter --.
Line 50, "matters" should read -- matter --.

UNITED STATES PATENT AND TRADEMARK OFFICE
CERTIFICATE OF CORRECTION

PATENT NO.     : 6,418,187 B1
DATED          : July 9, 2002
INVENTOR(S)    : Keiko Chiba et al.

It is certified that error appears in the above-identified patent and that said Letters Patent is hereby corrected as shown below:

Column 11,
Line 20, "wafer" should read -- wafer. --
Line 50, "matters" should read -- matter --.
Line 51, "matters" should read -- matter --, and "matters." should read -- matter --.

Column 14,
Line 44, "to" should read -- of --.

Signed and Sealed this

Eleventh Day of February, 2003

JAMES E. ROGAN
*Director of the United States Patent and Trademark Office*